United States Patent [19]

Goldie et al.

[11] 4,292,607

[45] Sep. 29, 1981

[54] BROADBAND CIRCUIT FOR MICROWAVE S/N ENHANCERS

[75] Inventors: Harry Goldie, Randallstown; Steven N. Stitzer, Ellicott City, both of Md.

[73] Assignee: Westinghouse Electric Corp., Pittsburgh, Pa.

[21] Appl. No.: 131,586

[22] Filed: Mar. 19, 1980

[51] Int. Cl.³ ............................ H01P 5/00; H01P 1/32
[52] U.S. Cl. .................................. 333/24.1; 333/1.1; 330/126
[58] Field of Search ............... 328/164; 333/24.1, 24.2

[56] References Cited

U.S. PATENT DOCUMENTS 4,159,454  6/1979  Willmore .................... 333/1.1 X Primary Examiner—Paul L. Gensler
Attorney, Agent, or Firm—W. E. Zitelli

[57] ABSTRACT

A microwave circuit network which combines a number of signal-to-noise enhancers of the magnetostatic wave excitation type, utilizing ferrite material, to extend the signal-to-noise enhancement frequency bandwidth beyond that which is offered individually by any one of the enhancers being combined while reducing substantially any signal interaction between the signal-to-noise enhancement operations thereof is disclosed.

5 Claims, 3 Drawing Figures

BROADBAND CIRCUIT FOR MICROWAVE S/N ENHANCERS

GOVERNMENT CONTRACT CLAUSE

The invention herein described was made in the course of or under a contract or subcontract thereunder with the Department of the Air Force bearing number F33615-79-C-1715.

BACKGROUND OF THE INVENTION

The invention relates to microwave circuits in general, and more particularly to a microwave circuit which combines a number of ferrite-type signal-to-noise enhancers to extend the signal-to-noise enhancement frequency bandwidth beyond that which is offered individually by any one of the enhancers being combined.

Just recently, completely passive two-port signal-to-noise enhancers have been developed utilizing the basic mechanism of exciting magnetostatic waves in ferrite-type material either in the form of a plurality of spheres or in the form of a film. An example of this type enhancer is disclosed in the copending U.S. application bearing Ser. No. 061,537, filed July 27, 1979 by John D. Adam and entitled "Magnetostatic Wave Signal-To-Noise Enhancer". In this example, an external bias field applied to the enhancer may be adjusted to select an operational frequency bandwidth in the frequency range over which the enhancer may be effectively excited to cause signal enhancement. Generally, enhancers of this type may be excited only over a limited frequency bandwidth. In the microwave frequency range of 2–5 GHz, for example, dependent upon the given ferrite material and the given bias field conditions, the effective operating frequency bandwidth may only be on the order of one-third octave. However, it is understood that by adjusting the bias field applied across the enhancer device, for example, it may be possible for the enhancer to cover different one-third octave segments over a given microwave frequency range.

Unfortunately, for some intended applications of this type enhancer, like in the area of electronic counter measures ECM, for example, it is desirable to cover frequency bandwidths on the order of an octave in the 2–5 GHz range. In these cases, in order to improve signal quality by enhancing the signal-to-noise ratio thereby, a system of more than one of the aforementioned type enhancers would be needed to cover the frequency bandwidth of all of the potential threat signals anticipated.

The parameters which predominantly limit the frequency response bandwidth of the enhancer are the saturation magnetization of the ferrite material utilized therein and the externally applied field strength. If a strong input signal has sufficient energy within the characteristic spin wave line width of the ferrite material and exceeds a power threshold level, it is passed relatively unattenuated through the enhancer. However, if the same amount of energy from an input signal is spread over a wide band of frequencies, the energy within the spin wave line width characteristic of the enhancer may not have sufficient strength to saturate the enhancer and will lose much of its power through insertion losses within the enhancer. Apparently, it is not enough for the input signals to fall within the responsive frequency bandwidth of the enhancer. They must also be coherent in nature or, in essence, have enough energy per unit bandwidth to cause excitation of the enhancer. In other words, the input signal power must exceed the characteristic power threshold level of the enhancer within the responsive frequency bandwidth thereof. Thus, the purpose of the enhancer is to prevent signals which fall in the characteristic frequency response bandwidth thereof and which have an energy content below a given power threshold level from passing relatively unattenuated therethrough. However, unlike amplifiers, input signals falling outside the responsive bandwidth of these enhancers, receive relatively low insertion losses in passing therethrough.

Attempts have been made to combine enhancers of the aforementioned type directly in cascade to achieve a greater enhancement frequency bandwidth. One problem which was observed from this configuration is that while the enhancers pass the signals from input to output which are outside of the bandwidth of the device, they do not pass them well. These enhancers act more like limiters outside of their characteristic response bandwidths. It is basically unpredictable what may happen to the signals passing through an enhancer of the aforementioned type having frequency content outside of the characteristic response bandwidth thereof; however, generally some insertion loss is evidenced. In some cases, this insertion loss may be high enough so that after the input signal passes through the first enhancer in cascade, there would be insufficient energy per unit bandwidth left in the signal by the time it got to the second enhancer in cascade, and so on, to operate them successfully, i.e., to excite the magnetostatic wave characteristics of the ferrite material. Therefore, a cascadedly-coupled enhancer configuration for purposes of extending the enhancement bandwidth thereof appears to be operationally ineffective for these purposes.

An alternative direct parallel configuration of the enhancers was also given consideration. However, in analysis, it appears that the energy of the input signals outside of the characteristic response bandwidth would pass through the enhancers with low insertion losses. Ostensibly, in a parallel configuration of the enhancers, some input signals may tend to leak around those enhancers specified to attenuate them and go through with relative low insertion losses those enhancers which were not designed to offer attenuation. Consequently, problems associated with mixing of signals, interaction and possibly intermodulation of signals are anticipated and the resulting signals would be entirely unpredictable.

It is therefore an object of the disclosure found hereinbelow to offer a microwave circuit for combining a plurality of the aforementioned type enhancers to extend their overall signal-to-noise enhancement frequency band-width to one more suitable and desirable for applications such as electronic countermeasures, for example.

SUMMARY OF THE INVENTION

In accordance with the present invention, a microwave circuit having an input port and an output port comprises N parallel branches which are operative, in combination, to enhance the signal-to-noise ratio of an input signal over a predetermined frequency bandwidth. More specifically, in each branch is disposed a signal-to-noise enhancer of the magnetostatic wave excitation type utilizing ferrite material, each enhancer being adjustedly operative over a predetermined sub-band of frequencies of the predetermined frequency bandwidth. The frequency composition of the N sub-bands covers the range of the predetermined frequency bandwidth. A first combination of microwave circuits is coupled between the input and N parallel branches to distribute the input signal to the N signal enhancers in accordance with the corresponding operational frequency sub-bands respectively associated therewith and to reduce substantially interaction between the operations of the enhancers at the branch inputs. A second combination of microwave circuits is coupled between the output port and the N parallel branches to combine the output signals from the N signal enhancers to form an enhanced composite signal at the output port and to reduce substantially interaction between the operations of the enhancers at the branch outputs.

DESCRIPTION OF THE PREFERRED EMBODIMENT

Figure 1:
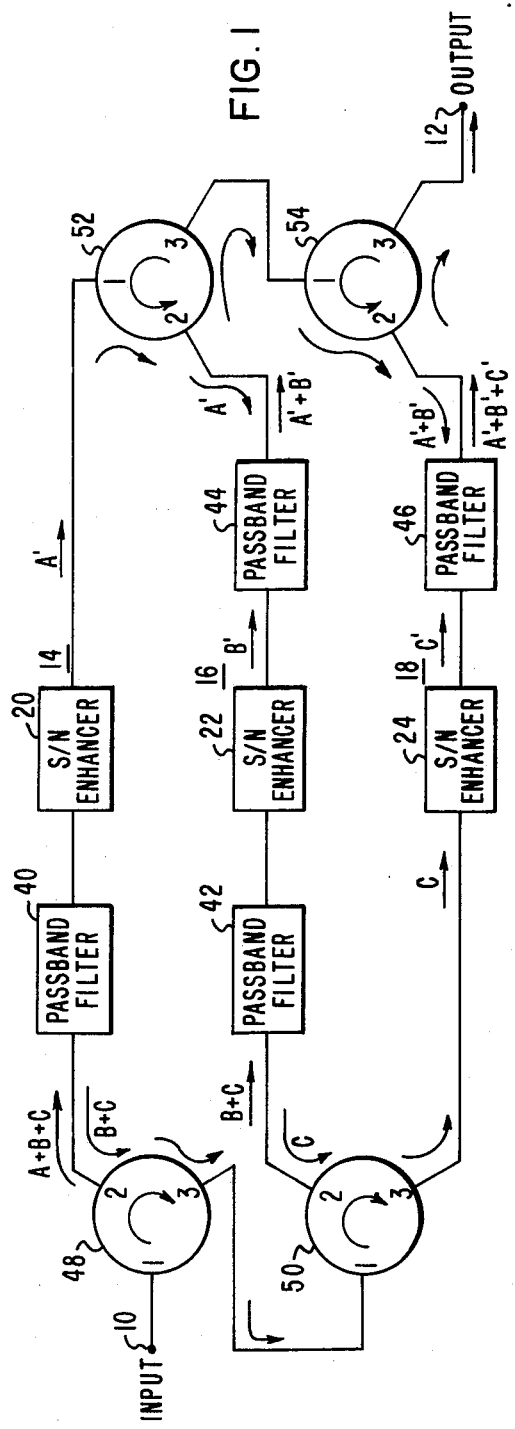
FIG. 1 is a block diagram schematic of a microwave circuit network suitable for embodying the principles of applicants' invention.

Depicted in FIG. 1 is an embodiment of a microwave circuit network having an input port at 10 and an output port at 12 and comprising a first 14, a second 16, and a third 18 circuit branch arranged in a parallel configuration. The three network branches 14, 16, and 18 are operative, in combination, to enhance the signal-to-noise (S/N) ratio of an input signal over a predetermined frequency bandwidth, like an octave, for example, in a microwave frequency range.

Signal-to-noise enhancers 20, 22 and 24 may be disposed, respectively, in the network branches 14, 16, and 18. Signal-to-noise enhancers 20, 22, and 24 may be of the type which function by exciting magnetostatic waves in a ferrite material which may be configured as a film in one case and a plurality of spheres in another. Due to the excitation characteristics of the ferrite material of the S/N enhancers 20, 22, and 24, each may only be conventionally adjusted to operate over a portion of sub-band of the frequencies over the predetermined frequency bandwidth of the network. For a more detailed understanding of a typical S/N enhancer reference is herein made to the aforementioned copending U.S. patent application Ser. No. 061,537. An example of the adjusted operational frequency sub-bands of the S/N enhancers 20, 22, and 24 is depicted in the graph of FIG. 2.

Figure 2:
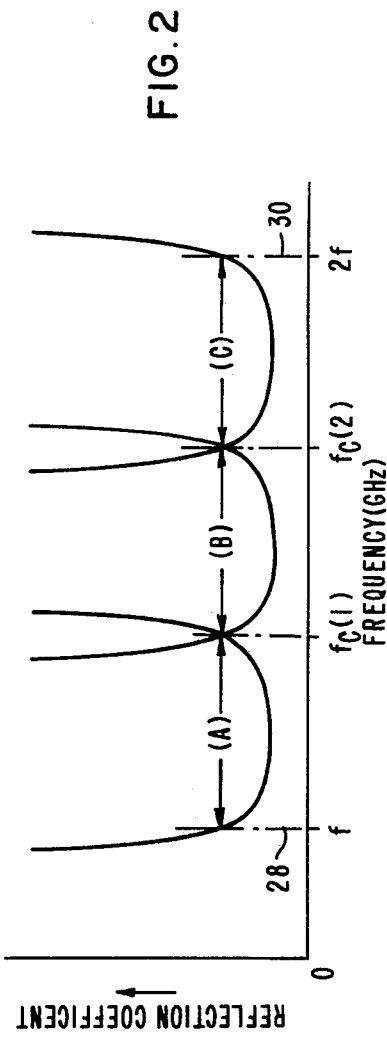
FIG. 2 is a graph illustrating passband filter characteristics of three sub-bands of frequencies suitable for use in the embodiment of FIG. 1.

Referring to FIG. 2, the operating frequency bandwidth of the network may be considered for descriptive purposes as an octave of frequencies from f to 2F shown between the dashed lines 28 and 30. It may be assumed for the present embodiment that a passband filter (not shown in FIG. 1) may be employed upstream of the input port 10 of the network and allow passage of only those signals having frequencies within the predeterined frequency bandwidth of say f to 2f, for example. For the present example then, the enhancer 20 of the first network branch 14 may be adjusted to operate over the frequency sub-band denoted as (A) which includes substantially those signals having frequencies from f to $f_c(1)$, the enhancer 22 may be adjusted to operate over the frequency sub-band denoted as (B) and will operate substantially on signals having frequencies over the range $f_c(1)$ to $f_c(2)$, and finally enhancer 24 may be adjusted to operate over the frequency sub-band denoted as (C) which includes substantially those signals having frequencies over the range of $f_c(2)$ to 2f. Thus, the combination of predetermined operational side bands adjusted in the enhancers of 20, 22, and 24 include all the frequencies of the octave bandwidth from f to 2f. In general, the octave bandwidth for most applications may be in the microwave frequency range, say 2-5 GHz, for example.

Conventional microwave passband filters 40 and 42 may be disposed respectively in the network branches 14 and 16 and coupled accordingly to the input of the corresponding S/N enhancer 20 and 22. The passband filters 40 and 42 may be operative to pass, with relatively low insertion losses, signals having frequencies substantially within the adjusted operational frequency sub-band of the signal enhancer coupled thereto and to reflect signals having frequencies outside of these frequency sub-bands. Similar microwave passband filters 44 and 46 may also be disposed respectively in the network branches 16 and 18 coupled accordingly to the output of the S/N enhancers 22 and 24. In the embodiment of FIG. 1, the microwave passband filters 40, 42, 44 and 46 may be designed to have 35 dB insertion loss over a frequency range of say 100 MHz away from their associated cross-over frequency points. In the microwave frequency range of say 2-5 GHz, for example, these characteristics represent a very sharp dropoff. Because the cutoff is designed relatively sharp outside of the passband of each of the filters, the out-of-band energy signals are effectively prevented from going through the wrong enhancer.

To achieve this characteristic of steepness of the passband filter edges, a number of filter stages, say 10-15, for example may be necessary in some cases. For this reason, evanescent mode filters which are normally small in structural size may be used. This type of filter structure may be comprised of a wave guide that has various resonant tuning elements in each of a series of resonant sections that are cascadedly coupled together resulting in a microwave bandpass filter which exhibits low insertion losses to those signals having frequencies within the sub-band thereof and high reflection capabilities for those signals outside of the designed filter bandwidth. However, it should be noted that the filter type described above is merely exemplary of the type of microwave filters which may be used in the present embodiment and that other types which may be made from lump components or using strip line techniques will be equally suitable when designed to function with the characteristics as described hereinabove.

In the present example, the passband filter 40 may be characterized to pass those signals within the frequency range denoted as A in FIG. 2 and have a high reflection coefficient for those signals having frequencies outside of the sub-band A. Similarly, the passband filters 42 and 44 may be characterized to pass with relatively low insertion losses those signals within the frequency sub-band denoted at B in FIG. 2 and have a high reflection coefficient for signals having frequencies outside of the band B. Finally, the passband filter 46 may be characterized to pass, with relatively low insertion losses, those signals having frequencies within the sub-band denoted at C in FIG. 2 and have a high reflection coefficient with respect to those signals having frequencies outside of this passband.

It is understood that it is impractical to implement perfect or ideal passband microwave filters primarily due to the improper matching of various elements and input/output ports of the filters. Therefore, it is expected that undesirable interactions may result between the operations of the input filters 40 and 42 and similarly the output filters 44 and 46 if directly connected. As a preventive measure against this filter interaction, 3-port microwave directional input circuits 48 and 50 may be disposed between the passband filters 40 and 42 and the S/N enhancer 24 and 3-port microwave directional output circuits 52 and 54 may be additionally disposed between the S/N enhancer 20 and the passband filters 44 and 46. As will be more fully understood from the operational description provided below, these input and output directional circuits 48, 50, 52, and 54, which for the present embodiment may be microwave circulators, direct the input, output and intermediate signals of the network along desirable paths to prevent substantially any interaction therebetween.

More specifically, the circulators 48, 50, 52, and 54 may be of the conventional type having a first, second, and third port and which may be operative to pass signals from the first port to the second port, and from the second port to the third port, unidirectionally. Circulator 48 may have its first port coupled to the input port 10, its second port coupled to the input of the passband filter 40 and its third port coupled to the first port of the circulator 50. Circulator 50 may have its second port coupled to the passband filter 42 and its third port coupled to the input of the S/N enhancer 24. At the output end of the network branches, the circulator 52 may have its first port connected to the output of the S/N enhancer 20, its second port coupled to the output of the passband filter 44, and its third port coupled to the first port of the circulator 54. Circulator 54 may have its second port coupled to the output of the passband filter 46 and its third port coupled to the output port 12 of the network.

As an example of operation of the embodiment of FIG. 1, an input signal comprising the signals having frequencies substantially within the octave bandwidth from f to 2f may be passed through the circulator 48 from ports 1 to 2 and conducted to the input of the passband filter 40. Only those signals having frequencies substantially within the passband A may be passed through the filter 40 with relatively low losses. The remaining signals having frequencies outside of the passband A denoted as B+C may be reflected back to the circulator port 2 and passed therethrough to port 3 and conducted to the circulator 50 at port 1. The reflected signal B+C may be passed through circulator 50 from ports 1 to 2 and conducted to the input of the passband filter 42 in the second network branch 16. Only those signals having frequencies substantially within the passband B are passed with relatively low insertion losses through the filter 42 and the remaining signals denoted as C may be reflected back to the port 2 of the circulator 50. The reflected signals C may be conducted through the circulator 50 from ports 2 to 3 and then to the input of the S/N enhancer 24 of the third network branch 18.

The signal enhancers 20, 22, and 24 may enhance the signal-to-noise ratio of the signals within their respective adjustedly set frequency sub-bands and may pass the enhanced signals denoted as A', B', and C' out accordingly. The enhanced signals A' of the first branch network 14 may be conducted from ports 1 to 2 of he circulator 52 and passed along to the passband filter 44 wherein it may be reflected. The enhanced signal B' may be passed through the passband filter 44 and combined with the reflected signals of A' at the output thereof. The combined signals of A' and B' may be conducted through the circulator 52 from port 2 to port 3 and passed along to the first port of the circulator 54. The combined signals A'+B' may then be conducted through the circulator 54 from ports 1 to port 2 and provided to the passband filter 46 where they may be rejected. The passband filter 46 may pass the signals of C' which are combined with the signals A' and B' at the output thereof and the combination of signals may be passed to port 2 of the circulator 54. The combined signals of A', B', and C' may then be conducted through ports 2 to 3 of 54 and provided to the output port of the network at 12.

In this manner, the signal enhancers 20, 22, and 24 which are of the type which may not characteristically enhance signals over a large frequency range, say an octave bandwidth, for example, may be combined in a twoport microwave circuit network such as shown in the embodiment described in connection with FIG. 1 to extend their enhancement capabilities to include all the signals over a much larger predetermined frequency range.

It is understood that the simple three-branch microwave circuit network described in connection with FIG. 1 was provided hereabove to facilitate an understanding of applicants' inventive principles. Furthermore, it is also understood that applicants' invention need not be limited to an embodiment of a three-branch microwave circuit network, but in more general terms, may be expanded to include an N-branch microwave circuit network similar to the block diagram schematic embodiment of FIG. 3.

Figure 3:
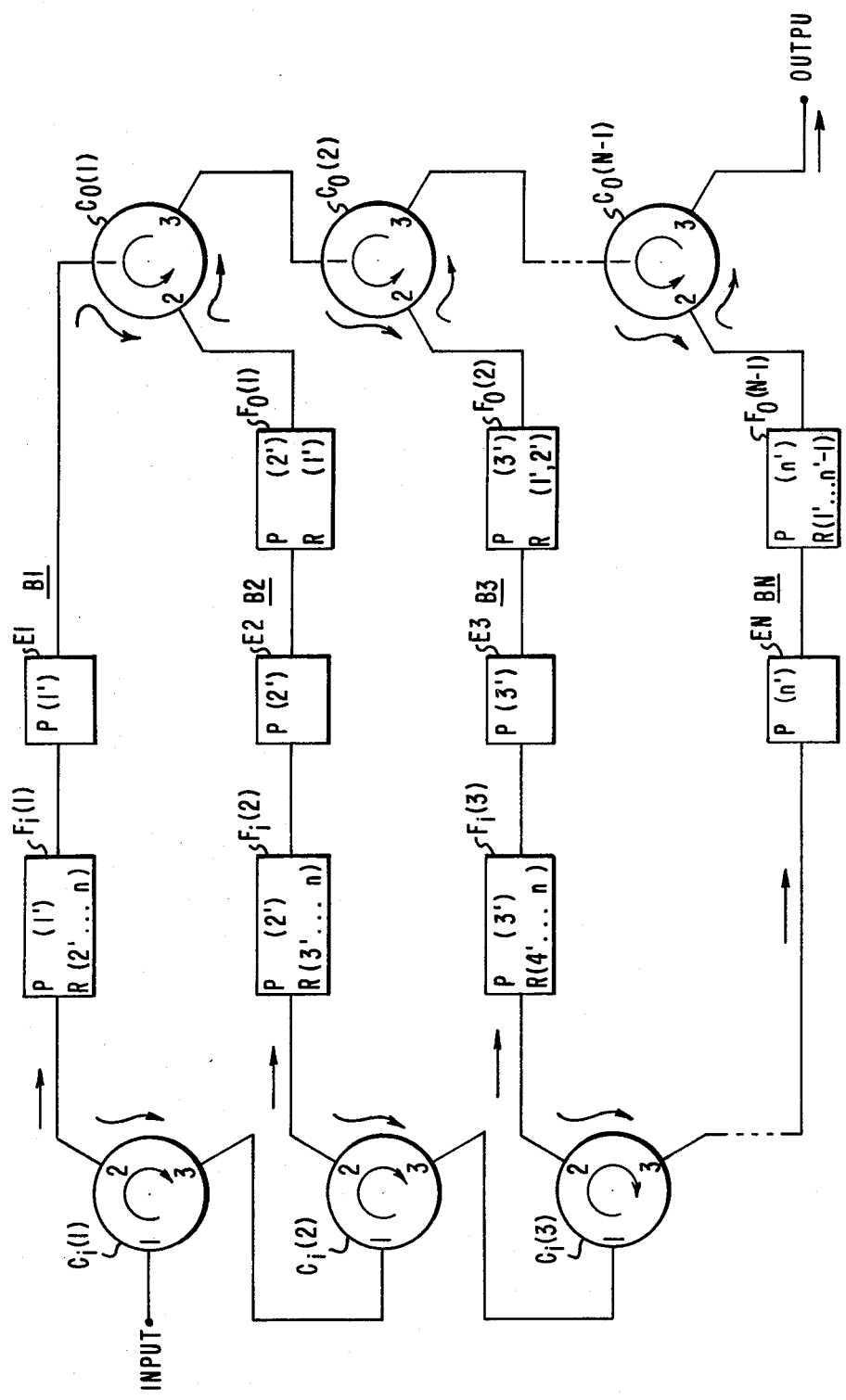
FIG. 3 is a more generalized block diagram schematic of a microwave circuit network suitable for embodying the present invention.

Similar to the embodiment of FIG. 1, the generalized embodiment depicted in FIG. 3 includes an S/N enhancer E1, E2, E3, . . ., EN disposed in each of the network branches B1, B2, B3, . . . BN, respectively. Likewise, a plurality of N −1 input microwave passband filters $F_i(1)$ through $F_i(N-1)$ may be disposed respectively in the first N −1 branches B1 through BN−1 of the network and coupled to the inputs of their corresponding enhancers. Accordingly, a plurality of N −1 output microwave passband filters $F_0(1)$ through $F_0(N-1)$ may be disposed respectively in the branches B2 through BN and correspondingly coupled to the output of their respective enhancer. Associated with each of the network circuit branches B1 through BN may be a selected sub-band or passband of frequencies enumerated as 1', 2', 3', . . . n' covering the overall range of the predetermined frequency enhancement bandwidth.

The generalized embodiment of FIG. 3 additionally includes a plurality of 3-port input microwave circuits denoted as $C_i(1)$ through $C_i(N-1)$ at the input of the parallel branches to direct the signals in a predetermined direction from one branch to another while affording provisions against input microwave filter operational interaction. Also, a plurality of output circuits $C_0(1)$ through $C_0(N-1)$ may be disposed at the outputs of the microwave network branches for combining the enhanced output signals of the branches while affording protection against interaction between the output microwave filters. The output circuit $C_0(N-1)$ combines the signals of all the frequencies covering the predetermined frequency bandwidth of the network and provides this combined signal to the output port of the network.

In operation then, the input signal may be provided through the input port to the first port of the input circuit $C_i(1)$ and conducted therethrough to input 2 and finally to the input filter $F_i(1)$. In $F_i(1)$, the sub-band denoted as 1' is passed substantially therethrough to the enhancer E1 and the remaining sub-bands 2' . . . , n' may be rejected and conducted through ports 2 and 3 of $C_i(1)$ to port 1 of $C_i(2)$ which may direct the reflected signals out of its port 2 to the second filter $F_i(2)$. The sub-band 2' may be passed substantially by the filter $F_i(2)$ to the enhancer E2 and the remaining subbands 3', . . . , n' may again be rejected and passed through circuit $C_i(2)$ to circuit $C_i(3)$ and finally to the next filter $F_i(3)$. In each of the subsequent input filters $F_i(3)$ through $F_i(N)$, the sub-band of frequencies associated therewith may be passed to the enhancer respectively corresponding thereto utilizing the input circuits $C_i(3)$ through $C_i(N-1)$.

In recombining the enhanced signals, the outputs signal of enhancer E1 may be provided to port 1 of the output circuits $C_o(1)$. Due to the directional operational nature of the circuit $C_o(1)$, the enhanced signal having frequencies in the sub-band 1' may be provided to the output of the filter $F_o(1)$ wherein it may be rejected and combined with the enhanced signal of E2 containing signals in the side band of 2'. The combined enhanced signals of 1' and 2' are conducted through the circuits $C_o(1)$ and $C_o(2)$ to the output of the filter $F_o(2)$ wherein they may be rejected. The filter $F_o(2)$ passes the enhanced output signal of E3 which, in turn, may be combined with the rejected signals of frequencies in the sub-bands 1' and 2' at the output thereof. In this manner, the enhanced signals of all of the frequency sub-bands covering the overall predetermined frequency bandwidth of the network are combined from branch to branch culminating in the circuit $C_o(N-1)$ which provides the overall enhanced signal to the output port of the network.

We claim:

1. A microwave circuit network having an input and an output port and comprising N parallel branches which are operative, in combination, to enhance the signal-to-noise ratio of an input signal over a predetermined frequency bandwidth, said network comprising:

a signal-to-noise enhancer of the magnetostatic wave excitation type utilizing ferrite material, disposed in each branch of said network, said predetermined operational frequency bandwidth of said network being comprised of N frequency sub-bands, each enhancer being adjustedly operative over a corresponding one of said frequency sub-bands exclusively;

an input passband microwave filter, disposed in each of a number of appropriate branches of said network and coupled to the input of the signal enhancer of the corresponding branch, for passing, with relatively low losses, signals having frequencies substantially within the adjusted operational frequency sub-band of the branch-related signal enhancer and for reflecting signals having frequencies outside of said corresponding frequency sub-band;

N −1 input microwave circuits, each having a first, second and third port and each operative to pass signals unidirectionally from said first to second ports and second to third ports, the first port of a first of said N −1 microwave circuits being coupled to the input port of the network, the second port of said first microwave circuit being coupled to the input passband filter of a first branch, and the third port thereof being coupled to the first port of another microwave circuit, each of the remaining N −2 microwave circuits having the second ports thereof coupled respectively to the input passband filters of corresponding network branches, the remaining microwave circuit coupled to the $i^{th}$ network branch having the third port thereof connected to the first port of the remaining microwave circuit coupled to the (i +1)th network branch, the remaining third port of a final microwave circuit being coupled to the signal enhancer of a final network branch;

an output passband microwave filter disposed in each of a number of appropriate branches of said network and coupled to the output of the signal enhancer of the corresponding branch, each output passband filter being operative to pass, with relatively low losses, signals having frequencies substantially within the adjusted operating frequency sub-band of said coupled enhancer and to reflect signals having frequencies outside of said frequency sub-band; and N −1 output microwave circuits each having a first, second and third port and each operative to pass signals unidirectionally from said first to second port and from said second to third ports, the first port of a first of said N −1 microwave circuits being coupled to the output of the enhancer disposed in a first branch of the network, the second port of said first microwave circuit being coupled to said output passband filter of a second branch of said network and the third port thereof being coupled to said first port of another of said N −1 microwave circuits, each of the remaining N −2 microwave circuits having the second ports thereof respectively coupled to said output passband filters of corresponding network branches, the remaining microwave circuit coupled to the $i^{th}$ network branch having the third port thereof connected to the first port of the remaining microwave circuit coupled to the (i +1)th branch, the remaining third port of a final microwave circuit being coupled to the output port of the network.

2. The microwave circuit network in accordance with claim 1 wherein each of the input and output N −1 microwave circuits are 3-port microwave signal circulators.

3. The microwave circuit network in accordance with claim 1 wherein the network consists of three parallel branches; wherein the predetermined operational frequency bandwidth of the network is an octave; and wherein each signal-to-noise enhancer is adjusted to operate substantially over a sub-band of approximately one-third of said octave bandwidth.

4. A microwave circuit network having an input and an output port and comprising a first, second and third branch configured in parallel which are operative, in combination, to enhance the signal-to-noise ratio of an input signal over an approximate octave frequency bandwidth in a microwave frequency range; said network comprising:

a signal-to-noise enhancer of the magnetostatic wave excitation type utilizing ferrite material, disposed in each branch of said network, each enhancer being adjustedly operative over a predetermined sub-band of frequencies of said operational octave bandwidth, the combination of predetermined operational sub-bands of said enhancers including all of the freqencies of said octave bandwidth;

an input passband microwave filter, disposed in each of said first and second branches and coupled to the input of said corresponding signal enhancer, for passing, with relatively low losses, signals having frequencies substantially within the adjusted operational frequency sub-band of the signal enhancer coupled thereto and for reflecting signals having frequencies outside of said frequency sub-band;

first and second microwave circulators, each having a first, second and third port, both being operative to pass signals unidirectionally from said first to second ports and from second to third ports, said first circulator having its first port coupled to the network input port, its second port coupled to said input passband filter of said first branch and its third port coupled to said first port of said second circulator, said second circulator having its second port coupled to said input passband filter of said second branch and its third port coupled to said signal enhancer of said third branch;

an output passband microwave filter, disposed in each of said second and third branches and coupled to the output of said corresponding signals enhancers, for passing, with relatively low losses, enhanced signals having frequencies substantially within the adjusted operational frequency sub-band of the signal enhancers coupled thereto and for rejecting enhanced signals having frequencies outside of said frequency sub-band; and third and fourth microwave circulators, each having a first, second and third port, both being operative to pass signals unidirectionally from said first to second ports and from second to third ports, said third circulator having its first port coupled to the output of said signal enhancer of said first branch, its second port coupled to the output of said output passband filter of said second branch and its third port coupled to said first port of said fourth circulator, said fourth circulator having its second port coupled to the output of said output passband filter of said third branch and its third port being coupled to said output port of said network.

5. The microwave circuit network in accordance with claim 4 wherein the signal-to-noise enhancers of said first, second and third branches are adjusted to be operative over low, intermediate and high-frequency sub-bands, respectively, which, in combination, cover the predetermined octave frequency bandwidth of the network.

* * * * *